United States Patent
Lee et al.

[11] Patent Number: 5,567,244
[45] Date of Patent: Oct. 22, 1996

[54] PROCESS FOR CLEANING SEMICONDUCTOR DEVICES

[75] Inventors: Chang-Jae Lee; Hyeung-Tae Kim, both of Seoul, Rep. of Korea

[73] Assignee: Goldstar Electron Co., Ltd., Cheongju, Rep. of Korea

[21] Appl. No.: 172,463

[22] Filed: Dec. 23, 1993

[30] Foreign Application Priority Data

Dec. 24, 1992 [KR] Rep. of Korea .................. 92-25455

[51] Int. Cl.$^6$ ................................................. B08B 3/08
[52] U.S. Cl. .................. 134/3; 134/36; 134/902; 437/946
[58] Field of Search ................. 134/2, 3, 34, 36, 134/902; 437/946

[56] References Cited

U.S. PATENT DOCUMENTS

| | | | |
|---|---|---|---|
| 4,171,242 | 10/1979 | Liu | 156/657 |
| 5,232,511 | 10/1993 | Bergman | 134/2 |

FOREIGN PATENT DOCUMENTS

| | | |
|---|---|---|
| 4-144131 | 5/1992 | Japan . |
| 4-263086 | 9/1992 | Japan . |

OTHER PUBLICATIONS

"Ultra–Clean Low Temperature SI Processes Under The Assistance Of Energy Controlled Ion Bombardment," 1991 International Conference On Solid State Devices And Materials, pp. 481–483, By T. Ohmi.

*Primary Examiner*—Donald E. Czaja
*Assistant Examiner*—Sean Vincent
*Attorney, Agent, or Firm*—Alan R. Loudermilk

[57] ABSTRACT

The present invention provides a process for cleaning semiconductor devices which enables the contamination of copper to maintained under a level of about $10^9$ atoms/cm$^2$ to meet the qualification of DRAMs of equal to or greater than 64M bits in capacity by means of supplying $O_3$ to a solution, resulting in great reproducibility and reliability. According to the present invention, a mechanism for removing a copper impurity in a semiconductor device uses oxygen to form a cupric oxide, which forms a cupric fluoride, which is then removed from the solution.

14 Claims, 1 Drawing Sheet

U.V. LIGHT

PROCESS FOR CLEANING SEMICONDUCTOR DEVICES

FIELD OF THE INVENTION

The present invention relates to processes for cleaning advanced semiconductor devices, and more particularly to processes to satisfy the demand for ultra high purity on the surface of semiconductors.

BACKGROUND OF THE INVENTION

In order to form a high quality film with ideal interface characteristics, an ultra clean surface must be prepared prior to film growth. An ultra clean surface is one which is characterized as a surface free from: particulates; organic contamination; metallic contamination; natural oxide; molecular adsorption; and surface micro-roughness. It is essential to control the molecular wafer-surface contamination, which has important consequences for the performance and reliability of semiconductor devices, particularly as device dimensions shrink and process temperatures decrease.

In particular, removal of metallic impurities from the surface of silicon is understood in terms of two principal parameters, namely the electron negativity and the heat of oxide formation of the metal. Metals that have higher electron negativity than that of silicon such as Pd, Cu, etc., tend to adhere on the silicon surface by an ion-exchange process. Metals that have a higher heat of metal oxide formation exhibit a tendency to be incorporated into silicon oxide formed during chemical cleaning processes. As a result, very efficient metal cleaning processes can be conducted using HF and $H_2O_2$ solutions without causing any degradation in surface micro-roughness.

As conventional cleaning processes for a semiconductor device, such as "SC1" ($NH_4OH:H_2O_2:H_2O=1:1:5$), "SC2" ($HCL:H_2O_2:H_2O=1:1:5$), and "SPM" ($H_2SO_4:H_2O_2=4:1$), and diluted HF solutions which consist of HF and $H_2O$, such are used/performed in a quartz bath supplied with nitrogen gases by means of a bubbling method. When an SC1-only cleaning solution is used for removing metal contamination, in general, the combination of a roughening effect and metal combination in the chemical oxide becomes the main cause of defect related breakdown.

Once silicon is exposed to SC1-mixture solutions, the peroxide will oxidize the silicon surface while the ammonia will etch this chemical oxide away; i.e. a chemical oxide layer will continually form and dissolve as a result of the compensating effect of the two chemical components. Consequently, this slowly etches the silicon. Hence the proportion of peroxide and ammonia in SC1 solutions has to be determined properly.

As the integration of semiconductor devices increases, so has the demand for ultra cleaning processes. To provide such advanced cleaning, various methods are being developed, and a mixture solution of HF and $H_2O_2$ has been proposed which is improved from that of HF and $H_2O$.

In fabricating a semiconductor device, there are specific kinds of metals, such as Fe, Cu, Ni, Z, etc., which have fatal effects on the characteristics of a circuit element. It typically is impossible to keep contamination under the level of $10^9$ atoms/cm$^2$ to meet the qualification of DRAM's of 64 megabits or greater with conventional methods and cleaning solutions for removal of Fe, Ni and Z.

Cu can be particularly problematic since it is the only metal which when present in an acid HF solution has a higher half-cell potential than hydrogen, and therefore can be deposited on the Si surface from an HF solution. This can be avoided by using ultra pure chemicals or by adding small amounts of $H_2O_2$ to the HF solution. Accordingly another method was provided with a cleaning process and mixture solutions consisting of HF and $H_2O_2$. Since these mixture solutions produce some particulates with the concentration of 50 ppb and peroxides may be reduced to water and oxygen atoms, it has been difficult to maintain a desirable concentration of peroxides, resulting in poor reproductivity.

SUMMARY OF THE INVENTION

The present invention has as an object to provide a cleaning process for semiconductor devices, which eliminates copper, to acquire the optimum concentration of impurities, and maintain a constant concentration of oxygen atoms, which will be combined with Cu ions to form CuO, by means of supplying $O_3$ continuously and sufficiently, resulting in great reproducibility.

A process for cleaning semiconductor devices according to present invention, includes the steps of: immersing a semiconductor device in an HF solution; and supplying $O_3$ bubbles into the HF solution.

A process for removing copper ions from semiconductor devices according to the present invention includes the steps of: producing oxygen atoms ([O]) by supplying $O_3$ into an HF solution; forming CuO by combining the oxygen ([O]) and a cupric ion ($Cu^{2+}$); forming cupric fluorides ($CuF_2$) by combining oxygen in the CuO and fluoride (F) in the HF solution through ion-exchange; and washing out the cupric fluorides by means of ultra pure deionized water.

BRIEF DESCRIPTION OF THE DRAWINGS

The above object and other advantages of the present invention will be more apparent by describing the present invention with reference to the attached drawings, wherein.

DESCRIPTION OF THE PREFERRED EMBODIMENTS

Figure 1:
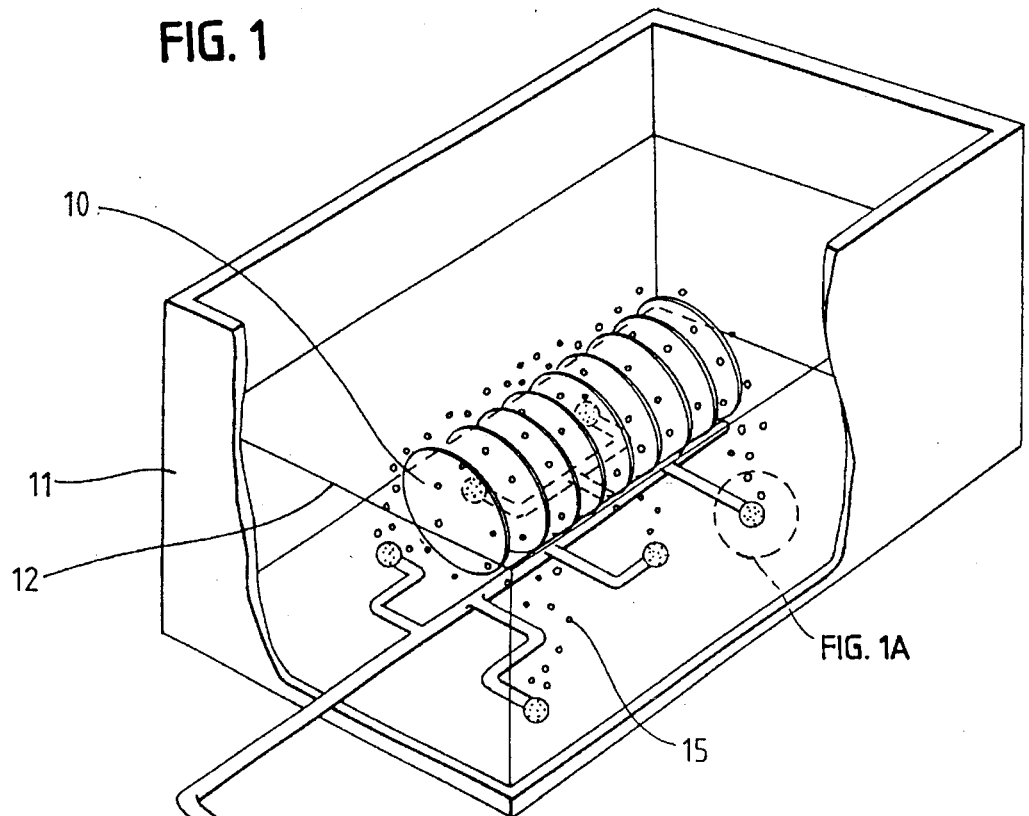
FIG. 1 and FIG. 1A illustrate an apparatus which may be used in the present invention.
Figure 1A:
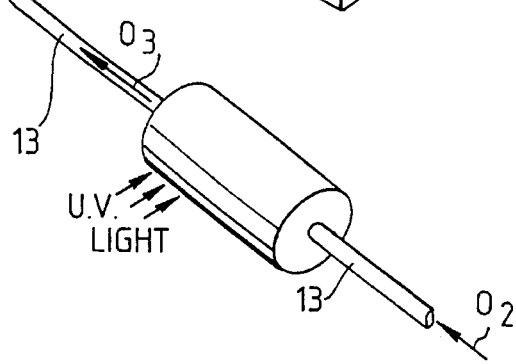

FIG. 1 and FIG. 1A illustrate an apparatus, a cleaning solution and a process for cleaning semiconductor devices according to the present invention.

Once semiconductor devices 10 (illustrated as wafers 10) are set up in quartz bath (container) 11, which contains HF solution 12 diluted with $H_2O$, $O_3$ is supplied by a bubbling method, a bubbling method as is known in the art, sending a desired quantity of $O_3$ through teflon tube 13 to quartz bath 11, wherein $O_3$ is produced by means of exposing the $O_2$ to ultra violet light through a transparent window (not shown) in teflon tube 13. Teflon tube 13 also has a plurality of perforated (with perforations 16) golfball-shaped nozzles 14 that are attached to the ends of teflon tube 13 and produce a large amount of $O_3$ bubbles 15 into HF solution 12, activating a cleaning process.

Then, the silicon surfaces cleaned in the aqueous HF solution are terminated mostly by Si—H bonds, becoming chemically stable against oxidization.

As $O_3$ supplied through a teflon tube is reduced into [O] and $O_2$, [O] oxidizes the metal impurity ($Cu^{2+}$) which is dissolved in the HF solutions or exists on the surface of the silicon crystals, where Cu acts as a catalyst to reduce $O_3$.

Copper impurities, commonly found in semiconductor process equipment and frequently deposited onto the surfaces of silicon wafers through ion exchange during processing, have larger electron negativity than silicon and a higher half-cell potential than hydrogen, so that they should be dissolved in HF solutions, i.e., having difficulty in oxidization, resulting in thermal deposition on the surfaces of both bare and oxidized silicon substrates.

In the process of the present invention, highly reactive oxygen [O] and cupric ions (Cu2+) are combined to form CuO molecules. Since oxygen has less electron negativity than fluorine (F), these materials carry out ion-exchanges with each other to form precipitates of cupric fluorides ($CuF_2$), which are chemically stable. After this process, cupric fluorides are washed out, or flushed from the HF-containing solution, by means of ultra pure DI or deionized water.

According to the present invention, a chemical cleaning mechanism for a semiconductor device is as follows.

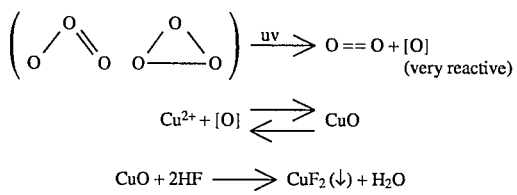

$$Cu^{2+} + [O] \rightleftharpoons CuO$$

$$CuO + 2HF \longrightarrow CuF_2(\downarrow) + H_2O$$

On cleaning a semiconductor device in accordance with the present invention, it is possible to keep the contamination under the concentration of $10^9$ atoms/$cm^2$ to meet the qualification of DRAMs of capacity equal to or greater 64M bits.

In addition, the present invention provides a cleaning process for semiconductor devices, which eliminates copper ions, to acquire the optimum concentration of impurities, and maintains a relatively constant concentration of highly reactive oxygen that will be combined with cupric ions to form CuO, by means of supplying $O_3$ continuously and sufficiently, resulting in great reproducibility and performance.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for cleaning semiconductor devices contaminated by Cu, comprising the steps of:

immersing a semiconductor device in an HF solution;

supplying $O_3$ bubbles into the HF solution, wherein Cu is removed from the semiconductor device and converted to cupric fluoride precipitates; and flushing the cupric fluoride precipitates from the HF solution.

2. The process of claim 1, wherein the HF solution is diluted with $H_2O$.

3. The process of claim 1, wherein the HF solution is contained in a quartz container.

4. The process of claim 1, wherein the $O_3$ bubbles are supplied through a tube which has a plurality of perforated nozzles.

5. The process of claim 4, wherein the perforated nozzles produce $O_3$ bubbles.

6. A process for removing copper ions in semiconductor devices, comprising the steps of:

producing oxygen atoms ([O]) by bubbling $O_3$ gas into an HF solution;

forming CuO by combining the oxygen ([O]) and a cupric ion ($Cu^{2+}$);

forming cupric fluoride precipitates ($CuF_2$) by combining oxygen in the CuO and fluorine (F) in the HF solution through ion-exchange; and flushing the cupric fluoride precipitates from the HF solution by means of de-ionized water.

7. A process for cleaning semiconductors contaminated by Cu, comprising supplying oxygen atoms by bubbling $O_3$ gas into an HF-containing solution containing the semiconductors, wherein Cu is removed from the semiconductors by combining oxygen and Cu atoms to form CuO, forming Cu-containing precipitates, and flushing the Cu-containing precipitates from the HF-containing solution.

8. The process of claim 7, wherein the oxygen is supplied by injecting $O_3$ bubbles into the HF-containing solution.

9. The process of claim 7, wherein the Cu-containing precipitates comprise cupric fluoride produced in the HF-containing solution.

10. The process of claim 8, wherein the Cu-containing precipitates comprise cupric fluoride produced in the HF-containing solution.

11. The process of claim 9, wherein the flushing step comprises flushing the cupric fluoride from the HF-containing solution.

12. The process of claim 10, wherein the flushing step comprises flushing the cupric fluoride from the HF-containing solution.

13. The process of claim 9, wherein the concentration of Cu atoms on the surface of the semiconductors is maintained about or below $10^9$ atoms/$cm^2$.

14. The process of claim 10, wherein the concentration of Cu atoms on the surface of the semiconductors is maintained about or below $10^9$ atoms/$cm^2$.

* * * * *